United States Patent [19]

Kissinger et al.

[11] Patent Number: 4,589,201
[45] Date of Patent: May 20, 1986

[54] PARALLEL ROLLER TOOL FOR UNLOADING SEMICONDUCTOR DEVICE SOCKETS

[75] Inventors: Carlos A. Kissinger; Raun L. Goode, both of Austin, Tex.

[73] Assignee: Motorola, Inc., Schaumburg, Ill.

[21] Appl. No.: 724,362

[22] Filed: Apr. 17, 1985

[51] Int. Cl.⁴ .............................................. H05K 3/30
[52] U.S. Cl. ......................................... 29/764; 29/235
[58] Field of Search .............. 193/35 R; 29/764, 740, 29/741, 235

[56] References Cited

U.S. PATENT DOCUMENTS

| | | | |
|---|---|---|---|
| 3,516,142 | 6/1970 | De Rose et al. | 29/203 |
| 3,731,866 | 5/1973 | Mason et al. | 228/6 |
| 3,832,764 | 9/1974 | Fletcher et al. | 29/203 |
| 4,136,444 | 1/1979 | Durney | 29/764 |
| 4,307,510 | 12/1981 | Sawyer et al. | 29/764 |
| 4,324,040 | 4/1982 | Gottlieb | 29/829 |
| 4,362,991 | 12/1982 | Carbine | 324/158 P |
| 4,420,880 | 12/1983 | Mielke | 29/764 |

*Primary Examiner*—Carl E. Hall
*Attorney, Agent, or Firm*—Anthony J. Sarli, Jr.; Jeffrey Van Myers; David L. Mossman

[57] ABSTRACT

A parallel roller tool for quickly and carefully unloading groups of semiconductor devices from spring-biased semiconductor device sockets. The parallel roller tool has a plurality of roller support plates which support the rollers and may serve to align them with various socket rows. Use of this roller tool permits rapid unloading of trays containing semiconductor devices without overstressing the trays or touching the semiconductor devices with the tool.

10 Claims, 3 Drawing Figures

PARALLEL ROLLER TOOL FOR UNLOADING SEMICONDUCTOR DEVICE SOCKETS

TECHNICAL FIELD

This invention relates generally to apparatus and methods for removing semiconductor devices from electrical interconnections and, in particular, to apparatus and methods for removing groups of semiconductor devices from such connections in rapid succession.

BACKGROUND ART

As packaged semiconductor devices become smaller and more complex, their handling, installation and removal from electronic circuits has become more difficult. Not only are the devices difficult to grasp, hold and position properly, there is increasing risk of damage to the packaged semiconductor device, particularly the delicate leads. As a result, there has been developed a considerable body of technology devoted to careful handling of semiconductor devices.

For example, U.S. Pat. No. 3,516,142 to DeRose et al, discloses a hand tool for gently inserting and removing semiconductor flatpacks to and from socket connections. A rod-shaped tool for lifting single pin-supported miniature electronic packages from sockets is taught in U.S. Pat. No. 3,832,764 to Fletcher et al. Semiautomatic devices for removing solid state, multicontact electrical circuit devices, such as dual-in-line packages (DIPs) which have been soldered in place on printed circuit boards are seen in U.S. Pat. No. 3,731,866 to Mason et al and U.S. Pat. No. 4,136,444 to Durney.

One particular area of concern in semiconductor device handling concerns the removal of large numbers of integrated circuit (IC) packages from a burn-in board after a burn-in operation. The burn-in operation is one of the last steps in the fabrication of ICs. In a conventional burn-in procedure, a plurality, typically forty, eighty or more, of semiconductor devices are mounted in sockets mounted on a burn-in board. The sockets are electrically connected through the thin copper foil leads of the printed circuit board, to which appropriate input logic and power signals are applied so that the ICs receive the appropriate logic and power signals during the burn-in process. During the burn-in process, the semiconductor devices are subjected to elevated temperatures in the range of 90° C. to 125° C. or more for a predetermined period of time, to test them under normal usage, or even abusive conditions.

Ordinarily, the sockets in the typical burn-in board are arranged in a plurality of parallel rows with space provided between adjacent rows of sockets. After the completion of the burn-in procedure, the individual IC packages are removed by the use of a hand tool, such as those previously noted, which lifts the IC packages from the sockets in which they were mounted during the burn-in procedure.

The use of most conventional hand removal tools to remove the heated integrated circuit packages from the board is a time- and labor-intensive, and thus costly operation. In addition, even when the semiconductor devices are removed from the burn-in board with care, the leads of at least some of the packages are invariably bent. If these bent leads are undetected, the IC will fail electrical tests; if the bent leads are detected, additional time and labor is required to restore the bent leads to their proper orientation with respect to the package. The process of directly removing the DIPs or IC packages is also bothersome to the worker since the packages are still hot when they are removed from the burn-in tray by conventional direct hand tools.

Structures offered as at least partial solutions to the problems associated with unloading burn-in boards include the multi-pronged clamp and pull device of U.S. Pat. No. 4,324,040 to Gottlieb, which removes all the IC packages from the burn-in board simultaneously. While the Gottlieb device is no doubt effective, it is evident that the multi-pronged clamp device and the IC packages enveloped thereby must be pulled away from the burn-in board very evenly. Any twisting or warping of the removal tool could result in damage to the burn-in board, the IC devices or the leads thereto or the removal device itself. U.S. Pat. No. 4,420,880 to Mielke reveals an elongated, wedge-shaped extraction tool for removing DIPs from a burn-in board, or the like, entire rows at a time and then slipping them into U-shaped packing tubes. This device is also useful, but because of its pointed tip, requires extreme care on the part of the operator to avoid severely damaging the leads extending from the IC packages by slight misalignment of the tool.

A more recent package design is a "leadless chip carrier" or LCC, also known as quadpacks because of the leads on all four sides of the package instead of on only two sides as in the case of the DIPs. The term "leadless" is not strictly accurate, because the leads are present along the outside surface edge of the square or rectangular, flat plastic or ceramic package. However, no leads extend out or away from the package body, but instead are relatively protected in place along the edges of the package. Typically, special sockets are required to make connection to LCCs. One popular type of LCC socket has a box-like configuration with an aperture in the center into which the LCC fits. Within the aperture are a number of leads spring-biased toward the center of the aperture designed to make electrical contact with the LCC leads as well as hold the LCC physically in place inside the socket. The spring-biased leads are held away from their interior position by pressing down on the lid of the socket, and the LCC may be removed from the aperture.

When these spring-biased semiconductor device sockets are used in large quantities on burn-in boards, a problem arises with how to get the LCCs out of the sockets faster than one at a time. One method is to use an array of tiny vacuum fingers to seize the LCCs out of the apertures as the socket lids are pressed down. A drawback to this technique is that the vacuum equipment would have to be complicated and expensive to build and operate. A straightforward approach would be to flip the burn-in board over and press it down in a catch tray and release all of the LCCs at once. The problem with this latter technique is that considerable pressure would have to be used to simultaneously release all of the LCCs, which may require expensive machinery. In addition, the pressure must be applied evenly to avoid warping the burn-in board and thus damaging the delicate copper leads thereon, or the spring-biased sockets.

The present invention solves these problems with a parallel roller tool. Two patents have been found which employ rollers to remove electronic components. U.S. Pat. No. 4,307,510 to Sawyer et al, teaches a screwdriver-like device mounted on wide rollers. The blade of the device serves to pry out the end of printed circuit cards mounted in a card rack with the rollers serving as a fulcrum. U.S. Pat. No. 4,362,991 to Carbine reveals an automatic coordinate axis system that runs on rollers for testing each IC package of the flat pack type arranged within a test tray full of such devices.

BRIEF SUMMARY OF THE INVENTION

Accordingly, an object of the present invention is to provide an improved apparatus and method for quickly and carefully removing a plurality of semiconductor devices from the sockets in which they reside.

Another object of the present invention is to provide a parallel roller tool for quickly unloading a burn-in tray which does not overstress the burn-in tray or the sockets thereon.

A further object of the present invention is to provide an improved parallel roller unloader tool which removes LCCs from sockets without touching the LCCs and thereby risking their damage.

Still a further object of the present invention is to provide a parallel roller tool that is mechanically simple and easy to operate.

In carrying out the above and other objects of the invention, there is provided, in one form, a parallel roller tool for rapid and careful unloading of semiconductor device sockets. The roller tool generally has a plurality of roller support plates held in a parallel, spaced apart relationship by a roller frame assembly. A pair of rollers is mounted between opposing support plates by means of coaxial cylindrical roller axles mounted perpendicularly in each support plate. The rollers of each pair are spaced apart and parallel to each other and are adapted to rotate upon their axles. Each pair of rollers is adapted to apply simultaneous pressure on either side of a semiconductor device socket which permits the semiconductor device to be released.

DETAILED DESCRIPTION OF THE INVENTION

Figure 1:
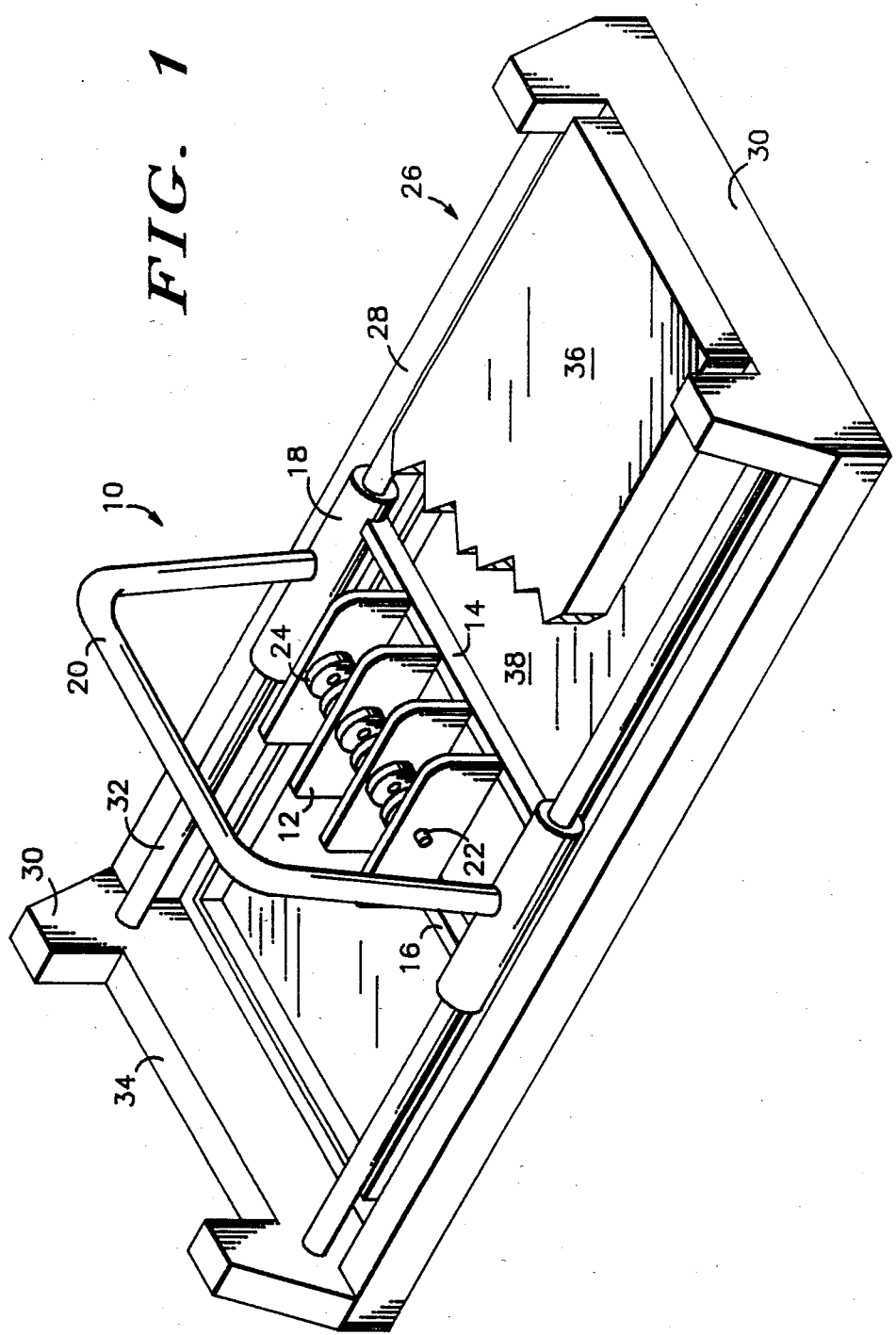
FIG. 1 illustrates a three-quarters view of the parallel roller tool constructed in accordance with this invention mounted within a burn-in tray unloading assembly.

Shown in FIG. 1 is a parallel roller tool 10 constructed in accordance with the present invention. Parallel roller tool 10 comprises, in the particular embodiment shown, a plurality of roller support plates 12 which are held in a parallel, spaced apart relationship or orientation from each other by a roller frame assembly 14. Roller frame assembly 14 may comprise, as shown in the particular embodiment, opposing plate support spacers 16 which bridge between and are connected across assembly slides 18. Optionally, a handle 20 may be connected to roller frame assembly 14 to permit more convenient manual manipulation of the parallel roller tool 10. As can be seen from FIG. 1, plate support spacers 16 hold roller support plates 12 in a parallel orientation evenly spaced apart from each other. Although only four roller support plates 12 are shown in FIG. 1, it will be appreciated that in actual practice many more roller plates 12 would be present on roller tool 10. Only a few are illustrated for the sake of drawing clarity.

Each roller support plate 12 has mounted within and perpendicular to it a cylindrical roller axle 22. Cylindrical roller axle 22 extends on either side of roller plate 12 and is designed to freely rotate within the roller plate 12. In addition, all of the cylindrical roller axles 22 are aligned so as to be coaxial with each other thus having an identical orientation with the corresponding roller plates 12.

A plurality of pairs of cylindrical rollers 24 are provided between each set of opposing roller support plates 12. The semiconductor device sockets to be unloaded will pass between each set of opposing roller support plates 12. Thus, a cylindrical roller 24 must be positioned on either side of this space or area to apply pressure to and unload the semiconductor device sockets. Each cylindrical roller 24 is coaxially mounted on the end of cylindrical roller axle 22 that extends outward from roller support plate 12. Cylindrical pressure rollers 24 are adapted to rotate with the cylindrical roller axles 22 they are mounted on, and each pair of cylindrical rollers 24 are further designed to apply simultaneous pressure on either side of the semiconductor device socket to permit release of the semiconductor device residing therein, as will be later described.

Also shown in FIG. 1 is an unloading rack 26 upon which is slidably mounted parallel roller tool 10. Unloading rack 26 comprises a rack base 28 which supports opposed end stop walls 30 which in turn support a pair of opposed tool glide rails 32 over which assembly slides 18 ride. Each end stop wall 30 contains unloading tray receiving slot 34 which is adapted to hold and support in a fixed position one end of an unloading tray 36 to be unloaded, such as a burn-in tray. Within the rack base 28 is preferably provided a removable semiconductor device catch tray 38 to catch and contain the semiconductor devices as they are removed from semiconductor sockets.

In operation, an unloading tray 36, such as a hot burn-in tray is placed in unloading tray receiving slots 34 of unloading rack 26 in an inverted or upside-down position. By use of handle 20, unloading tool 10 is passed under unloading tray 36 by sliding tool 10 along tool glide rails 32. Cylindrical rollers 24 will press evenly on semiconductor device sockets to release semiconductor devices which fall by gravity between rollers 24 into semiconductor device catch tray 38. This process will be illustrated in more detail infra.

Figure 2:
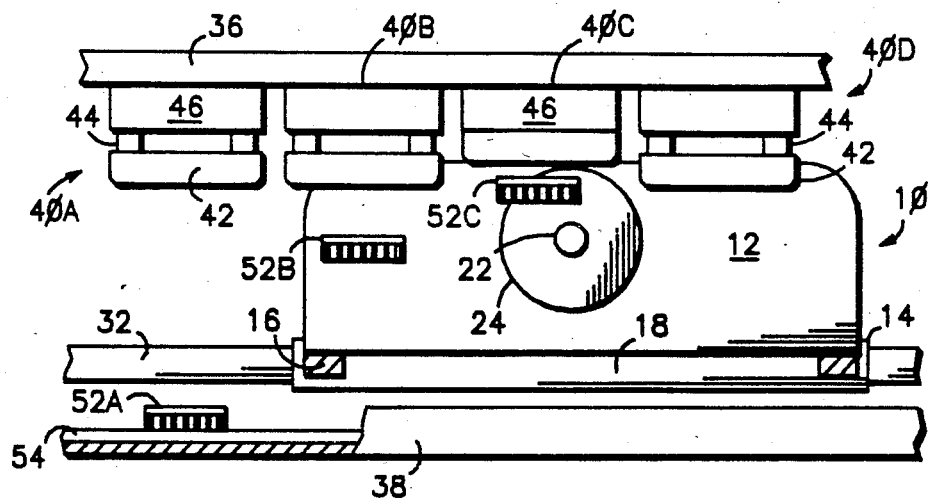
FIG. 2 illustrates a detailed side elevational view of the parallel roller tool of this invention as it unloads semiconductor devices from a line of sockets.

Shown in FIG. 2 is a side elevational detail view of part of parallel roller tool 10. The profile of roller support plate 12 may be seen along with an end view of cylindrical roller axle 22 mounted therein which supports and rotates cylindrical roller 24. Roller support plate 12 is held in correct position on either end by plate support spacers 16 which are perpendicularly mounted on assembly slides 18 thus forming roller frame assembly 14. Assembly slides 18 are adapted to ride upon tool guide rails 32, one of which is partially shown.

Above parallel roller tool 10 is shown an unloading tray 36 mounted in an inverted position having a plurality of downwardly oriented semiconductor device sockets 40. Each semiconductor device socket 40 has a socket lid 42 adapted to slide over glide pins 44 to meet socket body 46 which pull back socket leads 48 from the center of semiconductor device receiving aperture 50 thus permitting semiconductor device 52 to be released from socket 40.

Below parallel roller tool 10 is semiconductor device catch tray 38 shown as a cut-away partial section. Optionally catch tray 38 may be provided with impact cushion 54 adapted to absorb the impact of the falling delicate semiconductor devices 52.

In operation, parallel roller tool 10 is passed beneath unloading tray 36 by sliding on tool glide rails 32. Cylindrical rollers 24 upwardly presses each socket lid 42 along glide pins 44 toward socket body 46 which causes socket leads 48 to be pulled away from semiconductor device receiving aperture 50 (and the semiconductor device 52 being held in aperture 50 by spring-biased socket leads 48) to permit the semiconductor device 52 to fall into catch tray 38.

FIG. 2 present a sequential view of this process. Parallel roller tool 10 is passing from left to right under catch tray 36. Semiconductor device socket 40A has been unloaded for some time and its lid 42 has sprung back outward (downward) to resume its normal position. The semiconductor device 52A previously contained by socket 40A rests where it has fallen by gravity upon impact cushion 54. Semiconductor device socket 40B has been more recently unloaded and semiconductor device 52B it previously held is in the process of falling from socket 40B past roller support plate 12 to catch tray 38. As shown, roller 24 is in the process of unloading semiconductor device socket 40C. Socket lid 44 is pressed against socket body 46 and semiconductor device 52C is just beginning its descent past cylindrical roller 24. Semiconductor socket 40D remains to be unloaded and its lid 42 remains in its normally biased, outward position.

It may be noted from FIG. 2 that in one embodiment of the invention, the side profile of roller support plate 12 extends beyond the periphery of roller 24, slightly in the upward direction, and greatly forward and backward from roller 24. This extension of roller support plate 12 permits the roller tool 10 to be properly aligned with the array of sockets 40 on unloading tray 36. This alignment is accomplished because roller support plate 12 passes between the rows of sockets 40 thereby positioning plates 12 between sockets 40. As parallel roller tool 10 is symmetrical, it may unload equally well traveling in either direction.

Figure 3:
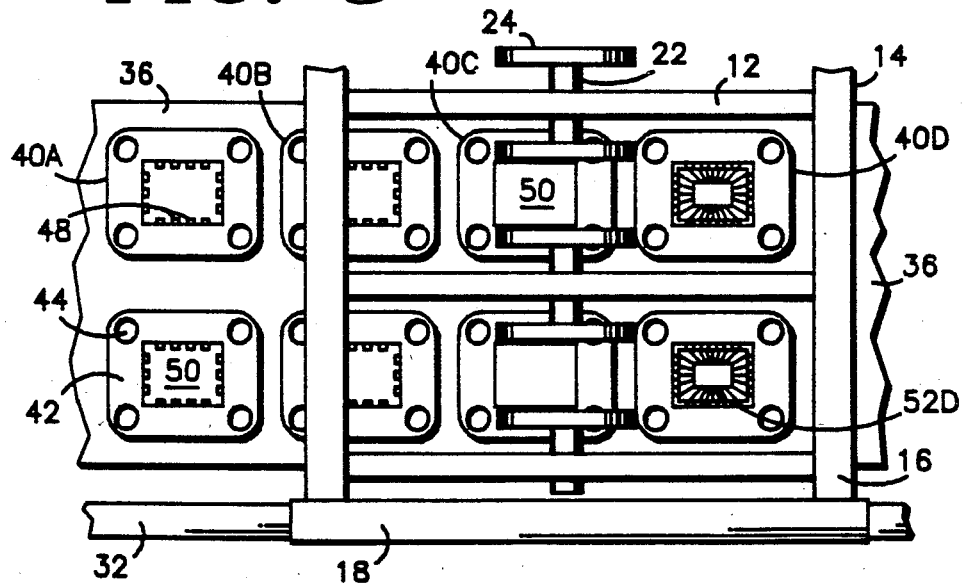
FIG. 3 illustrates a partial bottom plan view of the parallel roller tool of this invention as it unloads an inverted burn-in tray.

Shown in FIG. 3 is a partial bottom plan view of parallel roller tool 10 passing beneath unloading tray 36 which corresponds to the view sequence shown in FIG. 2. More particularly it may be seen how roller support plates 12 pass between each row of sockets 40. This permits the accurate positioning of cylindrical rollers 24 on each side of socket lid 42. The two cylindrical rollers 24 on either side of a particular socket 40 form a pair of rollers 24. It should be readily apparent that a pair of rollers 24 is necessary for each socket row for maximum unloading efficiency. The rollers 24 should be spaced far enough apart for semiconductor device 52 to fall down between them.

Again, semiconductor device sockets 40A and 40B have been unloaded and as viewed from below, their socket lids 42 and sockets leads 48 are back in their normal, spring-biased positions. It is noted that the receiving apertures 50 of sockets 40A and 40B are empty. Receiving apertures 50 of sockets 40C, which have just been unloaded, are likewise empty. However, since socket lid 42 of socket 40C is still depressed, socket leads 48 are still pulled back away from receiving apertures 50 and are thus not visible. Note that semiconductor device sockets 40D have not yet been unloaded and they still possess their semiconductor devices 52D held in place by socket leads 48.

It can be appreciated that one advantage of the present parallel roller tool 10 is that the semiconductor devices 52 are never touched by an extra tool during the unloading process. Further, the unloading tray 36 cannot be overstressed because only a small group of sockets 40 are unloaded at any one time. Even though the sockets 40 are unloaded in groups and not all at once, it can be appreciated that the parallel roller tool 10 can rapidly proceed along the socket groups and unload the entire unloading tray 36 in a few seconds. It may be further understood that the parallel roller tool 10 is extremely simple to operate, requiring only passing the tool 10 beneath unloading tray 36 whereby rollers 24 contact sockets 40 with sufficient pressure to unload semiconductor devices 52 therefrom.

We claim:

1. A parallel roller tool for rapid unloading of semiconductor device sockets comprising:
   a roller frame assembly holding a plurality of roller support plates in a parallel, spaced-apart relationship;
   a plurality of cylindrical roller axles, one each mounted within and perpendicular to each of said roller plates, extending on either side of said roller plate, for rotating within each said roller plate coaxially with the roller axles in the other roller support plates; and
   a plurality of pairs of cylindrical rollers one of each mounted on the facing ends of each adjacent roller axle coaxially therewith and for rotating therewith, each pair to apply simultaneous pressure on either side of the semiconductor device socket to permit the release of a semiconductor device.

2. The parallel roller tool for claim 1, wherein the roller support plates extend beyond the edges of the rollers to pass between the semiconductor device sockets and to position the rollers to meet the sides of the semiconductor device sockets.

3. The parallel roller tool of claim 1, wherein the semiconductor device sockets are spring-biased to hold a semiconductor device in electrical contact therein.

4. The parallel roller tool of claim 1, wherein the rollers are adapted to press upwardly on inverted semiconductor device sockets to permit the semiconductor devices to be released therefrom and fall by gravity into a catch tray.

5. A parallel roller tool for rapid and careful unloading of spring-biased semiconductor device sockets from an inverted unloading tray containing said sockets comprising:
   a roller frame assembly holding a plurality of roller support plates in a parallel, spaced-apart relationship;
   a plurality of cylindrical roller axles, one each mounted within and perpendicular to each of said roller plates, extending on either side of said roller plate, and for rotating within each said roller plate coaxially with the roller axles in the other roller support plates; and
   a plurality of pairs of cylindrical rollers, one of each mounted on the facing ends of each adjacent roller axle coaxially therewith and for rotating therewith, each pair of cylindrical rollers positioned to apply upward simultaneous pressure on either side of the spring-biased semiconductor device sockets to permit the release of semiconductor devices downward via gravity between the pairs of cylindrical rollers as said parallel roller tool passes beneath said inverted unloading tray.

6. The parallel roller tool of claim 5, wherein the roller support plates extend beyond the edges of the cylindrical rollers, to pass between the semiconductor device sockets and position the rollers to meet the sides of the semiconductor device sockets.

7. A parallel roller tool for rapid and careful unloading of ring-biased semiconductor device sockets from an inverted unloading tray containing said sockets comprising:

a roller frame assembly having a plurality of assembly slides for sliding along a plurality of parallel tool guide rails of an unloading rack, the roller frame assembly holding a plurality of roller support plates in a parallel, spaced-apart relationship;

a plurality of cylindrical roller axles, one each mounted within and perpendicular to each of said roller plates, extending on either side of said roller plate, and for rotating within each said roller plate coaxially with the roller axles in the other roller support plates; and a plurality of pairs of cylindrical rollers, one of each mounted on the facing ends of each adjacent roller axle coaxially therewith, each pair of cylindrical rollers positioned to apply upward simultaneous pressure on either side of the spring-biased semiconductor device sockets mounted in an inverted unloading tray fixed within the unloading rack over the parallel loading tool, to permit the release of the semiconductor devices downward via gravity between the pairs of cylindrical rollers as said parallel roller tool passes beneath said inverted unloading tray.

8. The parallel roller tool of claim 7, wherein the unloading tray is a burn-in tray.

9. The parallel roller tool of claim 7, wherein the roller support plates extend beyond the edges of the cylindrical rollers, to pass between the semiconductor device sockets and position the rollers to meet the sides of the semiconductor device sockets.

10. The parallel roller tool of claim 7, wherein the semiconductor devices are leadless chip carriers.

* * * * *